(12) United States Patent
Abuellil et al.

(10) Patent No.: US 10,924,121 B1
(45) Date of Patent: Feb. 16, 2021

(54) NO FALSE LOCK DLL

(71) Applicant: Shenzhen Goodix Technology Co., Ltd., Shenzhen (CN)

(72) Inventors: Amr Abuellil, San Diego, CA (US); Ahmed Emira, San Diego, CA (US); Janakan Sivasubramaniam, San Diego, CA (US)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/788,284

(22) Filed: Feb. 11, 2020

(51) Int. Cl.
*H03K 5/14* (2014.01)
*H03L 7/081* (2006.01)
*H03L 7/089* (2006.01)

(52) U.S. Cl.
CPC .............. *H03L 7/0816* (2013.01); *H03K 5/14* (2013.01); *H03L 7/0891* (2013.01)

(58) Field of Classification Search
CPC ...... H03B 19/00; H03L 7/0996; H03L 7/0997
See application file for complete search history.

(56) References Cited

U.S. PATENT DOCUMENTS

| 7,157,949 B2 * | 1/2007 | Chen | H03L 7/0812 327/149 |
| 7,372,310 B2 * | 5/2008 | Lee | H03L 7/0997 327/115 |
| 7,733,138 B2 * | 6/2010 | Uehara | H03L 7/0891 327/149 |

* cited by examiner

*Primary Examiner* — Hai L Nguyen
(74) *Attorney, Agent, or Firm* — Kilpatrick Townsend & Stockton LLP

(57) ABSTRACT

A DLL circuit is disclosed. The DLL circuit includes a delay line, configured to receive a delay line input clock, and to generate a plurality of output clocks each having a phase based on a delay of the delay line. The DLL circuit also includes a control circuit, configured to selectively cause the delay line input clock to be equal to one of a DLL input clock and an inverted one of the output clocks of the delay line, and an edge combiner, configured to generate a DLL output clock based on the output clocks of the delay line.

20 Claims, 7 Drawing Sheets

NO FALSE LOCK DLL

FIELD OF THE INVENTION

The present application generally pertains to Digital Locked Loops (DLLs), and more particularly to DLLs having improved mechanisms for locking.

BACKGROUND OF THE INVENTION

DLLs produce an output frequency based on an input clock, for example, generated based on a crystal oscillator. The acquisition process of generating the appropriate output frequency is conventionally slow and prone to error, called false locking. Improvements in DLL architecture are needed in the art.

BRIEF SUMMARY OF THE INVENTION

One inventive aspect is a DLL circuit. The DLL circuit includes a delay line, configured to receive a delay line input clock, and to generate a plurality of output clocks each having a phase based on a delay of the delay line. The DLL circuit also includes a control circuit, configured to selectively cause the delay line input clock to be equal to one of a DLL input clock and an inverted one of the output clocks of the delay line, and an edge combiner, configured to generate a DLL output clock based on the output clocks of the delay line.

In some embodiments, the DLL circuit also includes a voltage generator configured to generate an analog voltage based on a phase difference between the DLL input clock and the inverted output clock of the delay line, where, while the control circuit causes the delay line input clock to be equal to the DLL input clock, the control circuit is configured to change the delay of the delay line based on the analog voltage.

In some embodiments, the voltage generator includes a phase frequency detector, configured to generate a phase difference output based on the phase difference between the DLL input clock and the inverted output clock of the delay line, a loop filter, configured to store the analog voltage, and a charge pump, configured to modify the analog voltage according to the phase difference output of the phase frequency detector.

In some embodiments, while the control circuit causes the delay line input clock to be equal to the inverted output clock of the delay line, the control circuit is configured to change the delay of the delay line based on an indication of the delay of the delay line.

In some embodiments, the DLL circuit also includes a delay sense circuit, where the control circuit is configured to receive the indication of the delay of the delay line from the delay sense circuit.

In some embodiments, the delay sense circuit includes a counter configured to count according to the DLL input clock and to reset in response to the inverted output clock of the delay line, and an output of the counter provides the indication of the delay of the delay line to the control circuit.

In some embodiments, the delay line is programmable, and, while the control circuit causes the delay line input clock to be equal to the inverted output clock of the delay line, the control circuit is configured to change the delay of the delay line by programming the programmable delay line.

In some embodiments, the delay line includes a plurality of delay stages, each having a current starved inverter, and, while the control circuit causes the delay line input clock to be equal to the DLL input clock, the control circuit is configured to change the delay of the delay line by changing the current to the current starved inverters.

In some embodiments, the control circuit causes the delay line input clock to be equal to the inverted output clock of the delay line in response to at least one of the phase and frequency of the delay line being different from the DLL input clock by an amount greater than a threshold.

In some embodiments, the threshold corresponds with a condition that a frequency of the inverted output clock of the delay line is approximately half of a frequency of the DLL input clock.

In some embodiments, the control circuit causes the delay line input clock to be equal to the DLL input clock in response to at least one of the phase and frequency of the delay line being different from the DLL input clock by an amount less than a threshold.

In some embodiments, the threshold corresponds with a condition that a frequency of the inverted output clock of the delay line is approximately half of a frequency of the DLL input clock.

Another inventive aspect is a method of operating a DLL circuit. The method includes: with a delay line of the DLL circuit, receiving a delay line input clock, and generating a plurality of output clocks each having a phase based on a delay of the delay line. The method also includes: with a control circuit of the DLL circuit, selectively causing the delay line input clock to be equal to one of a DLL input clock and an inverted one of the output clocks of the delay line, and with an edge combiner of the DLL circuit, generating a DLL output clock based on the output clocks of the delay line.

In some embodiments, the method also includes, with a voltage generator, generating an analog voltage based on a phase difference between the DLL input clock and the inverted output clock of the delay line, where, while the control circuit causes the delay line input clock to be equal to the DLL input clock, the control circuit changes the delay of the delay line based on the analog voltage.

In some embodiments, the voltage generator includes a phase frequency detector, configured to generate a phase difference output based on the phase difference between the DLL input clock and the inverted output clock of the delay line, a loop filter, configured to store the analog voltage, and a charge pump, configured to modify the analog voltage according to the phase difference output of the phase frequency detector.

In some embodiments, while the control circuit causes the delay line input clock to be equal to the inverted output clock of the delay line, the control circuit changes the delay of the delay line based on an indication of the delay of the delay line, and the method further includes, with the control circuit, receiving the indication of the delay of the delay line from the delay sense circuit, where the delay sense circuit includes a counter configured to count according to the DLL input clock and to reset in response to the inverted output clock of the delay line, where an output of the counter provides the indication of the delay of the delay line to the control circuit.

In some embodiments, the delay line is programmable, and, while the control circuit causes the delay line input clock to be equal to the inverted output clock of the delay line, the control circuit changes the delay of the delay line by programming the programmable delay line.

In some embodiments, the delay line includes a plurality of delay stages, each having a current starved inverter, where, while the control circuit causes the delay line input clock to be equal to the DLL input clock, the control circuit changes the delay of the delay line by changing the current to the current starved inverters.

In some embodiments, the control circuit causes the delay line input clock to be equal to the inverted output clock of the delay line in response to at least one of the phase and frequency of the delay line being different from the DLL input clock by an amount greater than a threshold, where the threshold corresponds with a condition that a frequency of the inverted output clock of the delay line is approximately half of a period of the DLL input clock.

In some embodiments, the control circuit causes the delay line input clock to be equal to the DLL input clock in response to at least one of the phase and frequency of the delay line being different from the DLL input clock by an amount less than a threshold, where the threshold corresponds with a condition that a frequency of the inverted output clock of the delay line is approximately half of a frequency of the DLL input clock.

DETAILED DESCRIPTION OF THE INVENTION

Particular embodiments of the invention are illustrated herein in conjunction with the drawings.

Various details are set forth herein as they relate to certain embodiments. However, the invention can also be implemented in ways which are different from those described herein. Modifications can be made to the discussed embodiments by those skilled in the art without departing from the invention. Therefore, the invention is not limited to particular embodiments disclosed herein.

Figure 1:
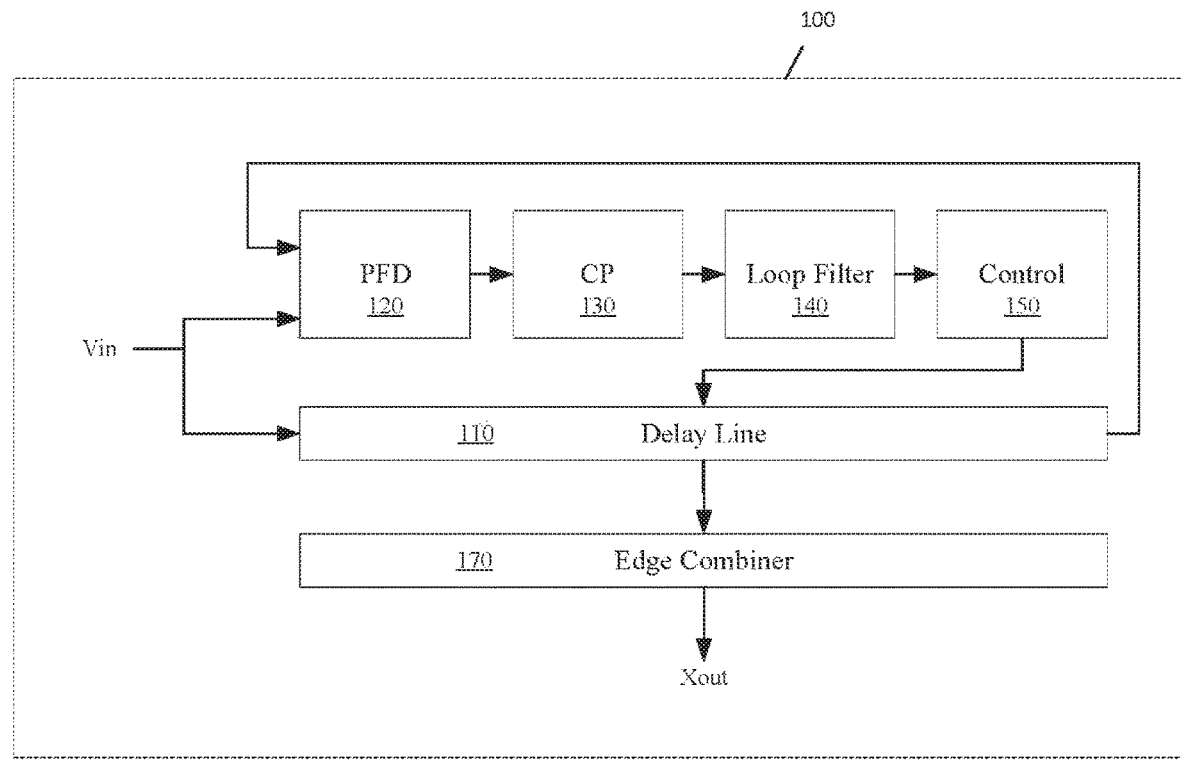
FIG. 1 is a schematic diagram illustrating a conventional DLL circuit.

FIG. 1 is a schematic diagram illustrating a conventional DLL circuit 100. DLL circuit 100 includes delay line 110, phase frequency detector (PFD) 120, charge pump (CP) 130, loop filter 140, control circuit 150, and edge combiner 170.

Delay line 110 is configured to receive an input or reference clock at node Vin. The input clock has a particular input frequency, generated, for example, by a crystal oscillator. Delay line 110 has multiple delay stages which collectively delay the input clock signal by a delay amount equal to the sum of the delays of each of the delay stages.

The delayed input clock signal and the undelayed input clock are provided to PFD 120. PFD 120 generates a series of signals, each indicating a time difference between particular edges of the delayed input clock signal and the undelayed input clock.

The series of signals generated by the PFD 120 are provided to charge pump 130. In response to the series of signals, charge pump 130 generates corresponding pulses for loop filter 140. The pulses generated by charge pump 130 for loop filter 140 cause a analog loop filter voltage to change.

Control circuit 150 influences the delay of each of the delay stages of the delay line 110 based on the analog loop filter voltage of loop filter 140.

As understood by those of skill in the art, delay line 110, PFD 120, charge pump 130, loop filter 140, and control circuit 150 collectively form a feedback loop which functions to align the phase and frequency of the input clock signal and the output signal of the delay line 110.

As understood by those of skill in the art, in some embodiments, a divide block (not shown) is placed between the output of the delay line 110 and the input of PFD 120. In such embodiments, delay line 110, PFD 120, charge pump 130, loop filter 140, and control circuit 150 collectively form a feedback loop which functions to align the phase and frequency of the input clock signal and the divided output signal of the delay line 110. In such embodiments, the output signal of the delay line has a frequency which is substantially equal to the frequency of the input clock signal times the division factor of the divide block.

Edge combiner 170 receives output signals from a number of the delay stages of the delay line 110, each received output signal corresponding with a different phase of the delayed clock. Edge combiner 170 is configured to generate an output clock based on the received phases. Any of a number of conventional edge combiner circuits performing this function may be used.

As understood by those of skill in the art, the architecture of DLL circuit 100 is subject to a false lock condition. As described above, it is desirable for the feedback of DLL circuit 100 to cause alignment of the phase and frequency of the input clock signal and the output signal of the delay line 110. When in a false lock condition, the feedback loop of DLL circuit 100 may cause alignment of the phase and frequency of the input clock signal and the output of the delay line 100 divided by or multiplied by an integer. For example, the feedback of DLL circuit 100 may cause alignment of the phase and frequency of the input clock signal and the output signal of the delay line 110, where the frequency of the output signal of the delay line 110 is two or more times the frequency of the input clock signal. Similarly, the feedback of DLL circuit 100 may cause alignment of the phase and frequency of the input clock signal and the output signal of the delay line 110, where the frequency of the output signal of the delay line 110 is one half or another integer fraction of the frequency of the input clock signal.

Conventional DLL circuits include a false lock detect circuit, which detects false lock conditions, and corrections circuitry which addresses the false lock condition.

Figure 2:
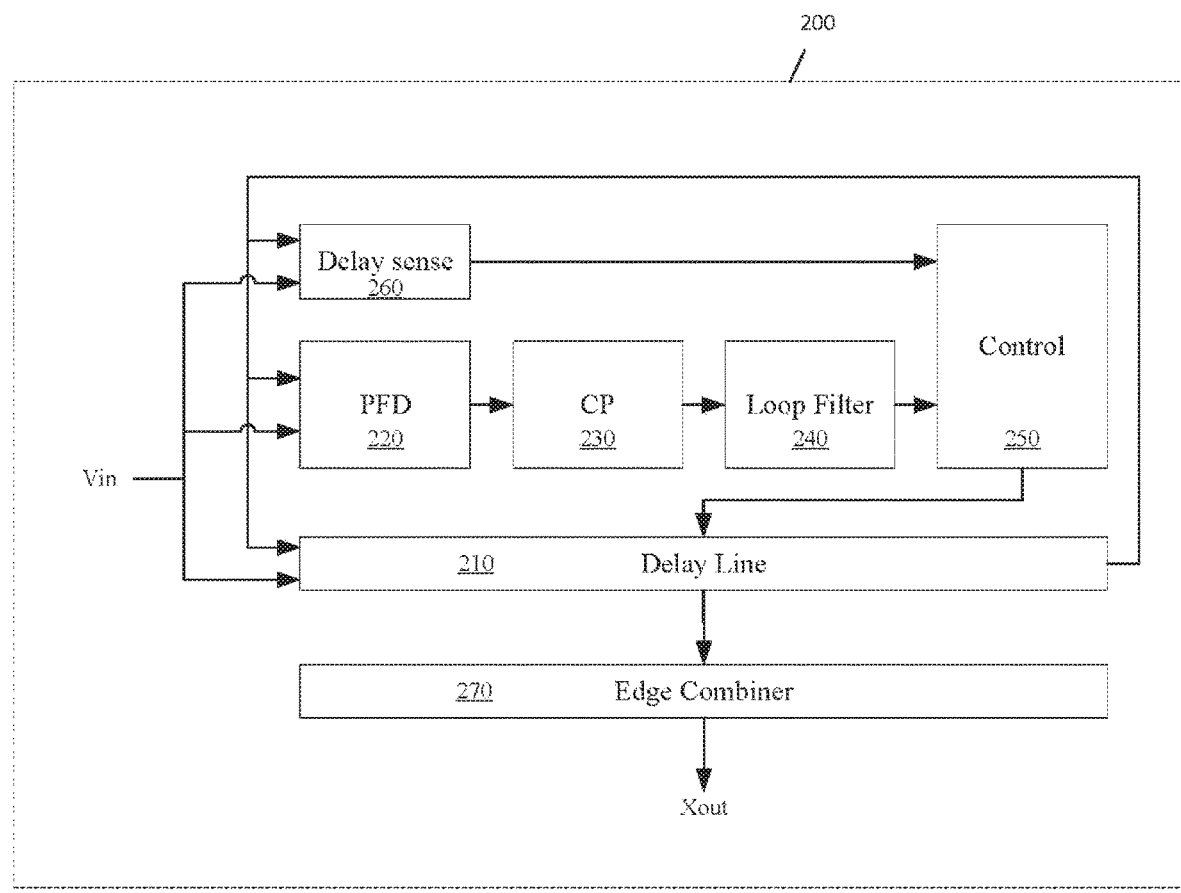
FIG. 2 is a schematic diagram illustrating a DLL circuit according to an embodiment.

FIG. 2 is a schematic diagram illustrating a conventional DLL circuit 200. DLL circuit 200 includes delay line 210, phase frequency detector (PFD) 220, charge pump (CP) 230, loop filter 240, control circuit 250, delay sense circuit 260, and edge combiner 270.

Delay line 210 is configured to receive an input clock at node Vin. The input clock has a particular input frequency, generated, for example, by a crystal oscillator. Delay line 210 has multiple delay stages which collectively delay the input clock signal by a delay amount equal to the sum of the delays of each of the delay stages.

The delayed input clock signal and the undelayed input clock are provided to PFD 220. PFD 220 generates a series of signals, each indicating a time difference between particular edges of the delayed input clock signal and the undelayed input clock.

The series of signals generated by the PFD 220 are provided to charge pump 230. In response to the series of signals, charge pump 230 generates corresponding pulses for loop filter 240. The pulses generated by charge pump 230 for loop filter 240 cause an analog loop filter voltage to change.

Control circuit 250 influences the delay of each of the delay stages of the delay line 210 based on the analog loop filter voltage of loop filter 240.

As understood by those of skill in the art, delay line 210, PFD 220, charge pump 230, loop filter 240, and control circuit 250 collectively form a feedback loop which functions to align the phase and frequency of the input clock signal and the output signal of the delay line 210.

As understood by those of skill in the art, in some embodiments, a divide block (not shown) is placed between the output of the delay line 210 and the input of PFD 220. In such embodiments, delay line 210, PFD 220, charge pump 230, loop filter 240, and control circuit 250 collectively form a feedback loop which functions to align the phase and frequency of the input clock signal and the divided output signal of the delay line 210. In such embodiments, the output signal of the delay line has a frequency which is substantially equal to the frequency of the input clock signal times the division factor of the divide block. For purposes of this application, in embodiments using a divide block as discussed, the output of the divide block is considered an output of the delay line 210.

Edge combiner 270 receives input and output signals from a number of the delay stages of the delay line 210, each received output signal corresponding with a different phase of the delayed clock. Edge combiner 270 is configured to generate an output clock at output node Xout based on the received phases. For example, edge combiner 270 may receive input and output signals from each of five delay stages, and generate an output clock at output node Xout based on the input and output signals. For example, edge combiner 270 may be configured to generate a clock having a frequency five times the frequency of the input clock signal based on the input and output signals from each of the five delay stages. Similarly, edge combiner 270 may be configured to generate a clock having a frequency three or seven times the frequency of the input clock signal based on the input and output signals from each of three or seven delay stages. Any of a number of conventional edge combiner circuits performing this function may be used.

The architecture of DLL circuit 200 is not subject to a false lock condition.

In response to the at least one of the phase and frequency of the delay line 210 being different from the input clock by an amount greater than a threshold, control circuit 250 causes the DLL circuit 200 to operate in a lock assist mode. Once the lock assist mode causes the at least one of the phase and frequency of the delay line 210 being different from the input clock by an amount less than the threshold, or less than another threshold (for example for hysteresis), the control circuit 250 causes the DLL circuit 200 to operate in a normal operating mode.

During the lock assist mode, the DLL circuit 200 is configured to program the delay line with a delay value approximately equal to the delay value for locked normal operation. Once the delay value of the delay line 210 is approximately equal to the delay value for normal operation, the DLL circuit 200 exits lock assist mode, and enters the normal operating mode, where the DLL feedback loop is used to modify the output signal of the delay line 210 such that its phase and frequency are approximately equal to that of the input clock signal.

During the lock assist mode, instead of receiving its input from the input clock at node Vin, the delay line 210 receives its input from the output of the delay line 210 in a loop back configuration. Therefore, during the lock assist mode, the delay line 210 does not receive input from and does not respond to the input clock at node Vin. Instead, because the output of the delay line 210 is connected to the input of the delay line 210, and because the delay line 210 is inverting, the delay line 210 acts as a ring oscillator while in the lock assist mode.

The desired condition for completion of the lock assist mode is that the delay of delay line 210 causes the ring oscillator to oscillate at a frequency approximately half the frequency of the input clock signal. As understood by those of skill in the art, this corresponds with the condition that the delay of delay line 210 is approximately equal to the period of the input clock signal.

During the lock assist mode, instead of control circuit 250 modifying the delay of the delay line 210 based on the analog loop filter voltage, control circuit 250 modifies the delay of delay line 210 based on a signal from delay sense circuit 260 where the signal from delay sense circuit 260 indicates whether the delay of delay line 210 is less than or is greater than a threshold value.

In some embodiments, during the lock assist mode, control circuit 250 modifies the delay of delay line 210 by changing the analog loop filter voltage based on whether the signal from delay sense circuit 260 indicates that the delay of delay line 210 is less than or is greater than the threshold value.

In alternative embodiments, the delay line 210 is programmable, and the control circuit 250 programs the delay line 210. For example, each of the outputs of the delay stages of the delay line 210 may be connected to a programmable capacitive load, and, during the lock assist mode, control circuit 250 modifies the value of the programmable capacitive loads based on whether the signal from delay sense circuit 260 indicates that the delay of delay line 210 should be increased or decreased according to whether the delay of the delay line is less than or is greater than a threshold value. In alternative embodiments, alternative delay programming methods may be used. In embodiments using a programmable delay line 200, during the lock assist mode, while the delay line 210 is being programmed, control circuit 250 may cause the analog loop filter voltage of loop filter 240 to be equal to a voltage substantially in the middle of a functional range of the analog loop filter voltage use during normal operation.

As discussed above, delay sense circuit 260 provides a signal indicating whether the delay of delay line 210 should be increased or decreased. In some embodiments, delay sense circuit 260 also provides a signal indicating whether the delay of delay line 210 is acceptable and should not be increased or decreased.

In some embodiments, delay sense circuit 260 comprises a resettable counter. For example, delay sense circuit 260 may comprise a counter which increments in response to receiving rising clock edges from the input clock in which is reset in response to receiving a rising edge from the output of delay line 210.

As understood by those of skill in the art, the desired condition that the delay of delay line 210 is approximately equal to the period of the input clock signal corresponds with the condition that to rising edges of the input clock occur for every one rising edge of the output of the delay line 210. Accordingly, in response to the counter having counted less than two rising edges of the input clock when being reset, the counter generates a signal for control circuit 250 indicating that the delay of delay line 210 should be increased. Additionally, in response to the counter having counted two or more rising edges of the input clock when being reset, the counter generates a signal for control circuit 250 indicating that the delay of delay line 210 should be decreased.

In some embodiments, control circuit 250 is configured to use the signals from delay sense circuit 260 with a linear search algorithm to determine that the delay of the delay line is approximately equal to the period of the input clock signal. In some embodiments, control circuit 250 is configured to use the signals from delay sense circuit 260 with a binary search algorithm to determine that the delay of the delay line is approximately equal to the period of the input clock signal.

Once the delay value of the delay line 210 is determined to be approximately equal to the period of the input clock signal, the DLL circuit 200 exits lock assist mode, and enters the normal operating mode, where the DLL feedback loop using the analog loop filter voltage is used to modify the output signal of the delay line 210 such that its phase and frequency are approximately equal to that of the input clock signal.

For example, the delay line stages may each include a current starved inverter, and the analog loop filter voltage may be used to control the current of the current starved inverters.

Because the DLL circuit 200 and enters normal operating mode after the delay value of the delay line 210 is approximately equal to the period of the input clock signal, the normal operating mode causes the DLL circuit 200 to properly lock, and therefore the DLL circuit 200 is not subject to false locking.

Figure 3:
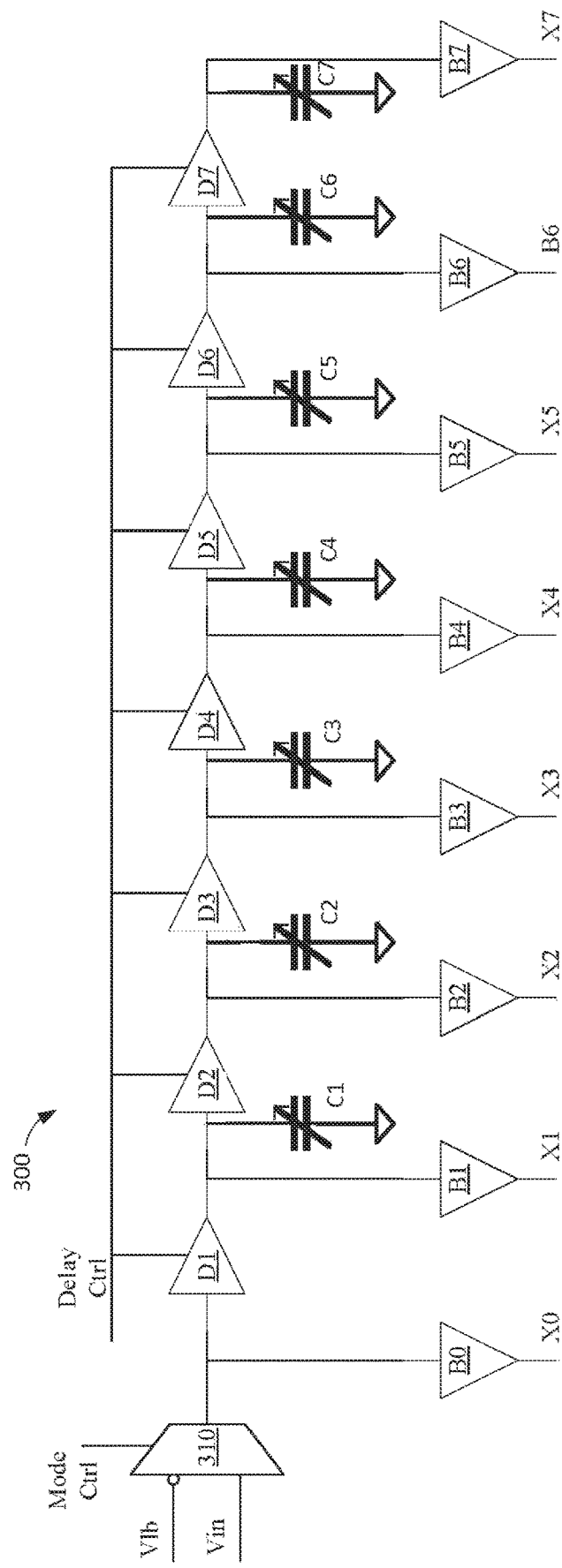
FIG. 3 is a schematic illustration of a delay line.
Figure 4:
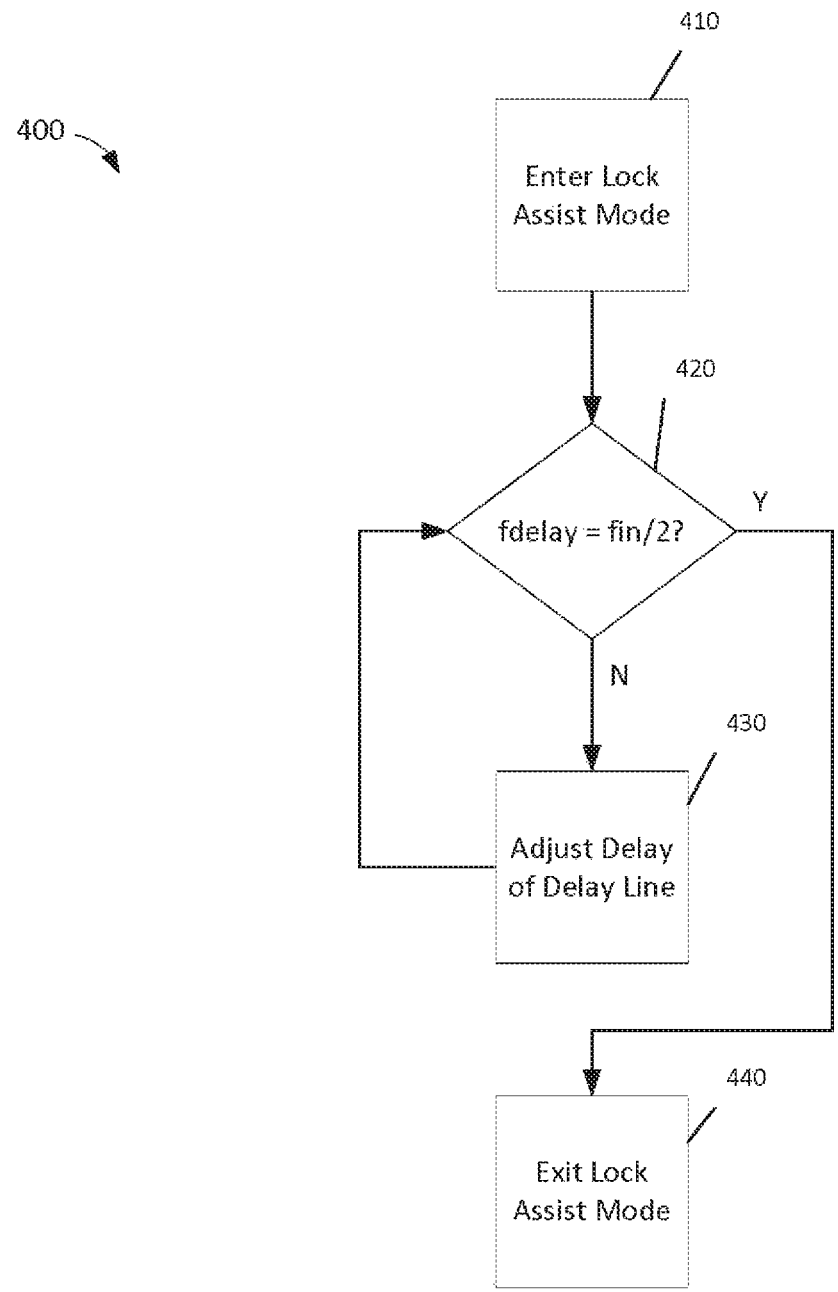
FIG. 4 is a flowchart diagram illustrating an embodiment of a method of operating an embodiment of DLL circuit.

FIG. 3 a schematic illustration of a delay line 300, which may be used as delay line 210 in DLL circuit 200 of FIG. 2. Other embodiments of delay lines may be used as delay line 210 in DLL circuit 200 of FIG. 2.

As shown, delay line 300 includes delay stages, multiplexer 310, D1-D7, programmable capacitors C1-C7, and buffers B1-B7.

The multiplexer 310 is configured to pass an inverted version of the loopback input at input node Vlb or to pass oscillator input at input node Vin to the first delay stage D1 according to a mode input signal at node Mode Ctrl. While in lock assist mode, multiplexer 310 is configured to pass the inverted version of the loopback input at input node Vlb to the first delay stage D1. While in normal operation mode, multiplexer 310 is configured to pass oscillator input and input node Vin to the first delay stage D1.

Delay stages D1-D7 may comprise any controllable delay stage, as known in the art. For example, each of delay stages D1-D7 may include one or more current starved inverters, as known in the art. During normal operation, the control circuit modifies a signal at node Delay Ctrl based on the analog loop filter voltage. In some embodiments, the voltage at node Delay Ctrl is equal to the analog loop filter voltage. In some embodiments, the voltage at node Delay Ctrl is based on the analog loop filter voltage. The propagation delay time of each of the delay stages D1-D7 is modified according to the signal at node Delay Ctrl.

As illustrated, each of delay stages D1-D7 drives a corresponding one of programmable capacitors C1-C7. During lock assist mode, the control circuit uses a search algorithm to determine that the delay of the delay line by modifying the capacitance of the programmable capacitors C1-C7, as discussed elsewhere herein.

Buffers B0-B7 generate corresponding clock signals X0-X7, as understood by those of skill in the art.

If used as delay line 210 in DLL circuit 200 of FIG. 2, when DLL circuit 200 is operated in the lock assist mode, clock signal X7 is used to generate the loopback input at input node Vlb.

Figure 5:
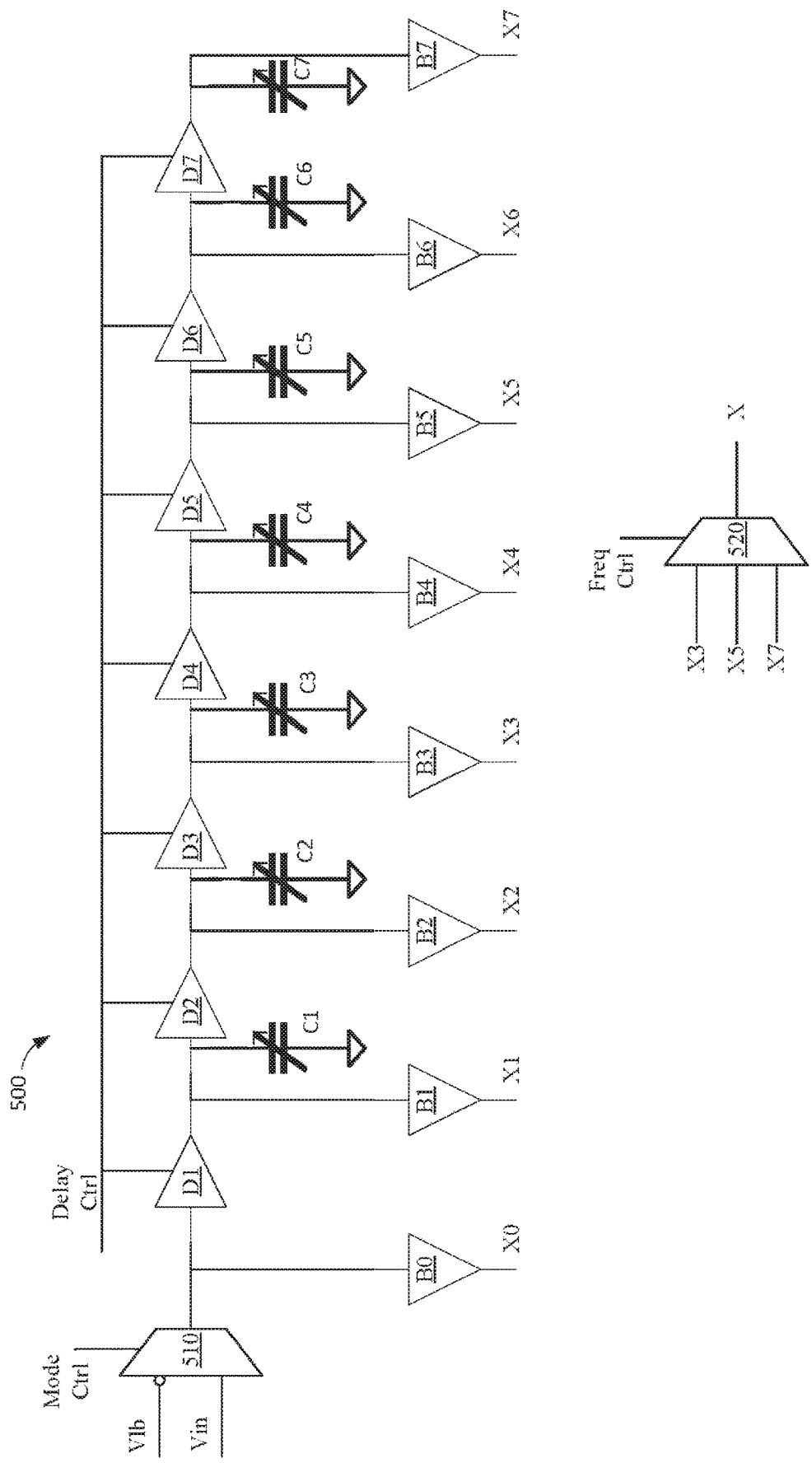
FIG. 5 is a schematic illustration of a delay line.

FIG. 5 is a flowchart diagram illustrating an embodiment of a method 400 of operating an embodiment of DLL circuit. In the described embodiment, DLL circuit 200, which has delay line 300 as its delay line, performs the method. The method may be performed by other DLL circuits.

At 410, control circuit 250 causes the DLL circuit 200 to operate in a lock assist mode. In some embodiments, the control circuit causes the DLL circuit to operate in lock assist mode in response to the at least one of the phase and frequency of the delay line 300 being different from the input clock by an amount greater than a threshold.

The control circuit 250 causes the DLL circuit to operate in the lock assist mode at least by changing the state of the mode input signal at node Mode Ctrl so as to cause multiplexer 310 of delay line 300 to pass an inverted version of the loopback input at input node Vlb to the first delay stage D1. In some embodiments, the control circuit also powers down one or more of delay stage D6, delay stage D7, buffer B6, and buffer B7, and forces the output of buffers B6 and B7 to be low. In addition, in some embodiments, the control circuit 250 causes the DLL circuit 200 to operate in the lock assist mode at least by causing the analog loop filter voltage of loop filter 240 to be equal to a voltage substantially in the middle of a functional range of the analog loop filter voltage use during normal operation. In addition, in some embodiments, the control circuit 250 causes the DLL circuit 200 to operate in the lock assist mode at least by performing a method of causing the delay of delay line 300 to become approximately equal to the period of the input clock signal by modifying the capacitance of programmable capacitors C1-C5 according to a linear or binary search algorithm, as described elsewhere herein.

At 420, control circuit 250 determines whether the at least one of the phase and frequency of the delay line 300 is different from the input clock by an amount greater than a threshold. For example, the control circuit 250 may determine whether the at least one of the phase and frequency of the delay line 300 is different from the input clock by an amount greater than a threshold based on signals from delay sense circuit 260, as discussed elsewhere herein.

In response to control circuit 250 determining that the at least one of the phase and frequency of the delay line 300 is different from the input clock by an amount greater than the threshold, the control circuit 250 determines whether the delay of the delay line should be increased or decreased, and the method proceeds to 430, where control circuit 250 increases or decreases the delay of the delay line.

Control circuit 250 may increase or decrease the delay of the delay line, for example, by changing a programming state of a programmable feature of the delay stages of the delay line. For example, as discussed elsewhere, control circuit 250 may increase or decrease the delay of the delay line by changing the capacitance values of programmable capacitors C1-C7 of delay line 300. As understood by those of skill in the art, increasing the capacitance values of the programmable capacitors C1-C7 increases the delay of the delay line, and decreasing the capacitance values of the programmable capacitors C1-C7 decreases the delay of the delay line.

Once the delay of the delay line is increased or decreased, the method returns to 420.

In response to control circuit 250 determining that the at least one of the phase and frequency of the delay line 300 is not different from the input clock by an amount greater than the threshold being used, the control circuit 250 causes the DLL circuit 200 to operate in a normal operating mode at 440.

The control circuit 250 causes the DLL circuit to operate in the normal operating mode at least by changing the state of the mode input signal at node Mode Ctrl so as to cause multiplexer 310 of delay line 300 to pass the input clock to the first delay stage D1. In some embodiments, the control circuit 250 causes the DLL circuit 200 to operate in the normal operating mode at least by causing the analog loop filter voltage of loop filter 240 to be modified by charge pump circuit 230. In some embodiments, to cause the DLL circuit 200 to operate in the normal operating mode, the control circuit 250 also resets the PFD 220.

In addition, in some embodiments, the control circuit 250 causes the DLL circuit 200 to operate in the normal operating mode by modifying delay of the delay stages D1-D7 of the delay line 300 by repeatedly modifying the output signal of the delay line 300 such that its phase and frequency become approximately equal to that of the input clock signal. For example, the delay line stages may each include a current starved inverter, and the analog loop filter voltage may be used to control the current of the current starved inverters.

FIG. 5 is a schematic illustration of a delay line 500, which may be used as delay line 210 in DLL circuit 200 of FIG. 2. Delay line 500 is configured to have a programmable output frequency. Other embodiments of delay lines may be used as delay line 210 in DLL circuit 200 of FIG. 2.

As shown, delay line 500 includes delay stages, multiplexer 510, D1-D7, programmable capacitors C1-C7, buffers B1-B7, and multiplexer 520.

The multiplexer 510 is configured to pass an inverted version of the loopback input at input node Vlb or to pass oscillator input at input node Vin to the first delay stage D1 according to a signal at mode input at node Mode Ctrl. While in lock assist mode, multiplexer 510 is configured to pass the inverted version of the loopback input at input node Vlb to the first delay stage D1. While in normal operation mode, multiplexer 510 is configured to pass oscillator input and input node Vin to the first delay stage D1.

Delay stages D1-D7 may comprise any controllable delay stage, as known in the art. For example, each of delay stages D1-D7 may include one or more current starved inverters, as known in the art. During normal operation, the control circuit modifies a signal at node Delay Ctrl based on the analog loop filter voltage. In some embodiments, the voltage at node Delay Ctrl is equal to the analog loop filter voltage. In some embodiments, the voltage at node Delay Ctrl is based on the analog loop filter voltage. The propagation delay time of each of the delay stages D1-D7 is modified according to the signal at node Delay Ctrl.

As illustrated, each of delay stages D1-D7 drives a corresponding one of programmable capacitors C1-C7. During lock assist mode, the control circuit uses a search algorithm to determine that the delay of the delay line by modifying the capacitance of the programmable capacitors C1-C7, as discussed elsewhere herein.

Buffers B0-B7 generate corresponding clock signals X0-X7, as understood by those of skill in the art.

Multiplexer 520 is configured to pass one of clock signals X3, X5, and X7 as the output of the delay line at output node X. In other embodiments, different clock signals and/or a different number of clock signals may be selected as the output of the delay line at output node X. Which of clock signals X3, X5, and X7 is passed is the output of the delay line is determined according to the signal at node or bus Freq Ctrl. The signal at node or bus Freq Ctrl is determined according to the control circuit.

In some embodiments, when operated in certain frequency modes, delay stages and/or buffers which are not used may be powered down. For example, if the clock signal X3 is passed as the output of the delay line, delay stages D4-D7 and/or buffers B4-B7 may be turned off by the control circuit, for example, to save power and/or noise.

If used as delay line 210 in DLL circuit 200 of FIG. 2, when DLL circuit 200 is operated in the lock assist mode, the output of the delay line at output node X is used to generate the loopback input at input node Vlb.

Figure 6:
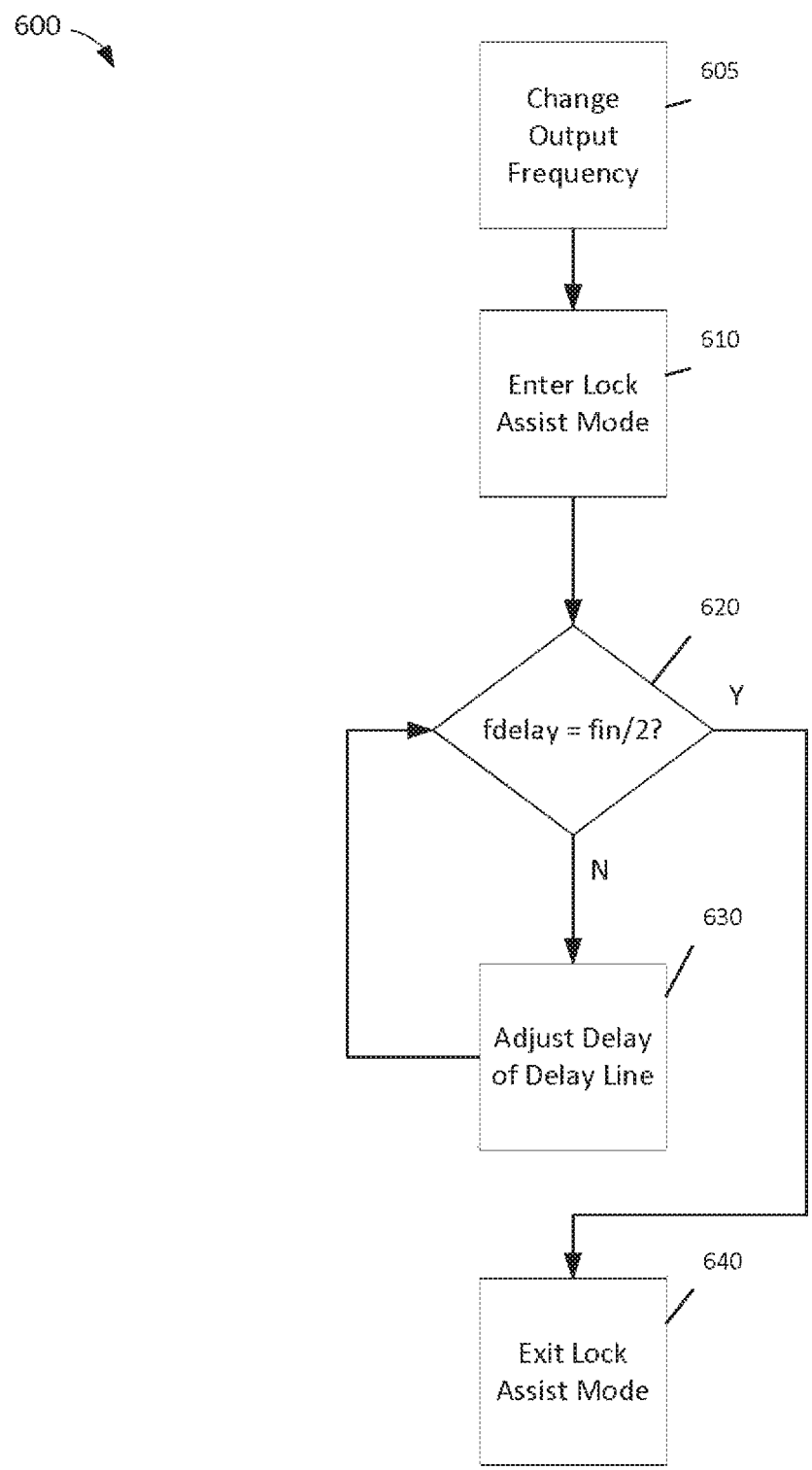
FIG. 6 is a flowchart diagram illustrating an embodiment of a method of operating an embodiment of DLL circuit.

FIG. 6 is a flowchart diagram illustrating an embodiment of a method 600 of operating an embodiment of DLL circuit. In the described embodiment, DLL circuit 200, which has delay line 500 as its delay line, performs the method. The method may be performed by other DLL circuits.

At 605, control circuit 250 changes the value of the signal at node or bus Freq Ctrl to cause DLL circuit 200 to change the frequency of the output clock at output node Xout. For example, while generating an output clock having a frequency seven times the frequency of the input clock, the control circuit 250 may change the value of the signal at node or bus Freq Ctrl to cause DLL circuit to change the frequency of the output clock to be five times the frequency of the input clock.

At 610, control circuit 250 causes the DLL circuit 200 to operate in a lock assist mode. In some embodiments, the control circuit causes the DLL circuit to operate in lock assist mode in response as part of a process of changing output frequency of the DLL circuit 200. In some embodiments, the control circuit causes the DLL circuit to operate in lock assist mode in response to the at least one of the phase and frequency of the delay line 500 being different from the input clock by an amount greater than a threshold, which occurs as a result of the change in output frequency of the delay line 500, which occurs as a result of the control circuit 250 changing the value of the signal at node or bus Freq Ctrl.

The control circuit 250 causes the DLL circuit to operate in the lock assist mode at least by changing the state of the mode input signal at node Mode Ctrl so as to cause multiplexer 510 of delay line 500 to pass an inverted version of the loopback input at input node Vlb to the first delay stage D1. In some embodiments, the control circuit also powers down one or more of delay stage D6, delay stage D7, buffer B6, and buffer B7, as these elements are no longer needed. In addition, in some embodiments, the control circuit 250 causes the DLL circuit 200 to operate in the lock assist mode at least by causing the analog loop filter voltage of loop filter 240 to be equal to a voltage substantially in the middle of a functional range of the analog loop filter voltage use during normal operation. In addition, in some embodiments, the control circuit 250 causes the DLL circuit 200 to operate in the lock assist mode at least by performing a method of causing the delay of delay line 500 to become approximately equal to the period of the input clock signal by modifying the capacitance of programmable capacitors C1-C5 according to a linear or binary search algorithm, as described elsewhere herein.

At 620, control circuit 250 determines whether the at least one of the phase and frequency of the delay line 500 is different from the input clock by an amount less than a threshold. For example, the control circuit 250 may determine whether the at least one of the phase and frequency of the delay line 500 is different from the input clock by an amount less than a threshold based on signals from delay sense circuit 260, as discussed elsewhere herein.

In response to control circuit 250 determining that the at least one of the phase and frequency of the delay line 500 is different from the input clock by an amount greater than the threshold, the control circuit 250 determines whether the delay of the delay line should be increased or decreased, and the method proceeds to 630, where control circuit 250 increases or decreases the delay of the delay line.

Control circuit 250 may increase or decrease the delay of the delay line, for example, by changing a programming state of a programmable feature of the delay stages of the delay line. For example, as discussed elsewhere, control circuit 250 may increase or decrease the delay of the delay line by changing the capacitance values of programmable capacitors C1-C5 of delay line 500. As understood by those of skill in the art, increasing the capacitance values of the programmable capacitors C1-C5 increases the delay of the delay line, and decreasing the capacitance values of the programmable capacitors C1-C5 decreases the delay of the delay line.

Once the delay of the delay line is increased or decreased, the method returns to 620.

In response to control circuit 250 determining that the at least one of the phase and frequency of the delay line 500 is not different from the input clock by an amount greater than the threshold being used, the control circuit 250 causes the DLL circuit 200 to operate in a normal operating mode at 640.

The control circuit 250 causes the DLL circuit to operate in the normal operating mode at least by changing the state of the mode input signal at node Mode Ctrl so as to cause multiplexer 510 of delay line 500 to pass the input clock to the first delay stage D1. In some embodiments, the control circuit 250 causes the DLL circuit 200 to operate in the normal operating mode at least by causing the analog loop filter voltage of loop filter 240 to be modified by charge pump circuit 230.

In addition, in some embodiments, the control circuit 250 causes the DLL circuit 200 to operate in the normal operating mode by modifying delay of the delay stages D1-D5 of the delay line 500 by repeatedly modifying the output signal of the delay line 500 such that its phase and frequency become approximately equal to that of the input clock signal. For example, the delay line stages may each include a current starved inverter, and the analog loop filter voltage may be used to control the current of the current starved inverters.

Figure 7:
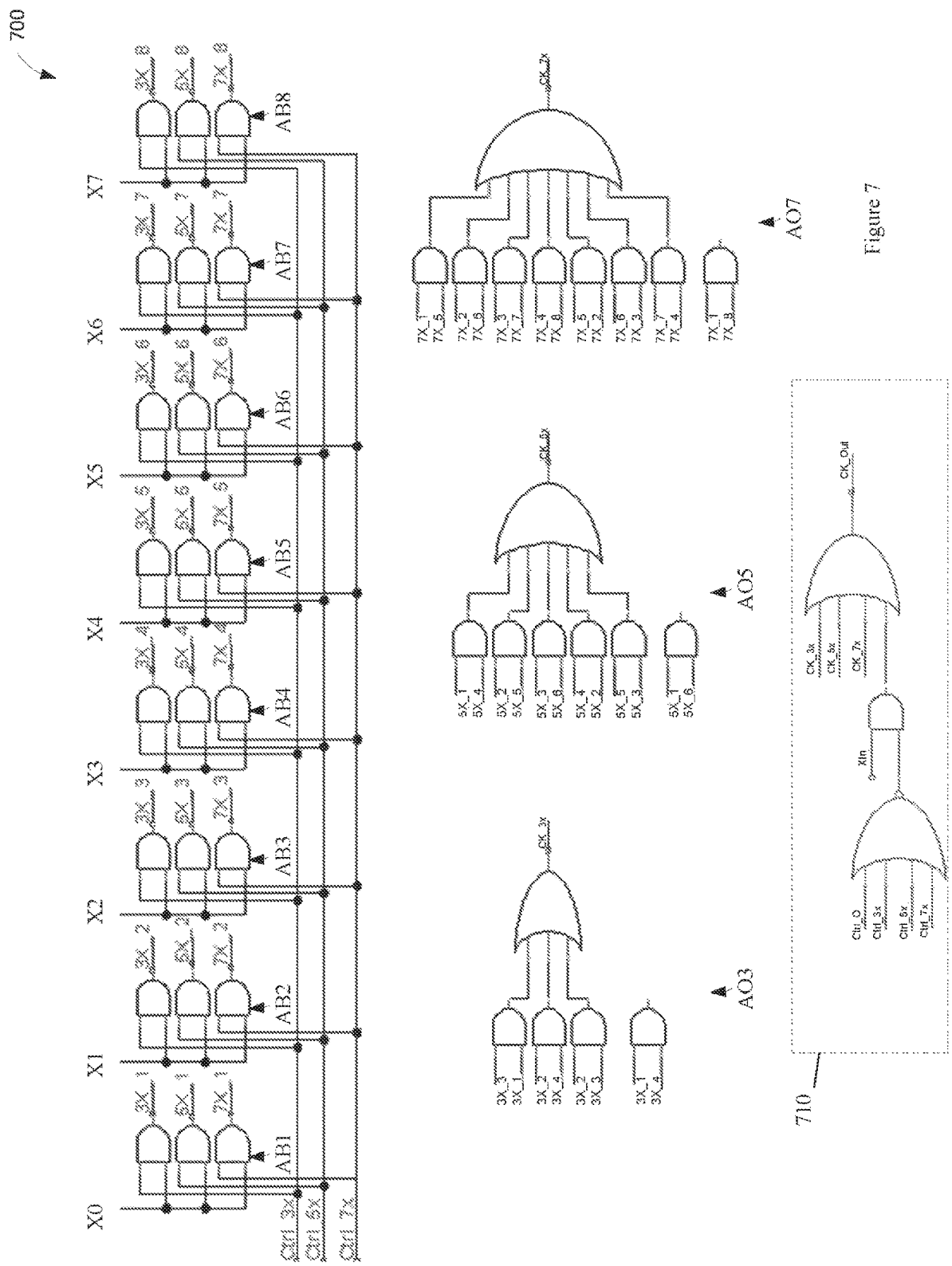
FIG. 7 is a schematic illustration of an embodiment of an edge combiner circuit.

FIG. 7 is a schematic illustration of an embodiment of an edge combiner circuit 700. Edge combiner circuit 700 may be used, for example, as the edge combiner circuit 270 of DLL circuit 200 of FIG. 2, where delay line 500 of FIG. 5 is used as the delay line 210 of DLL circuit 200 of FIG. 2. Other edge combiner circuits having features similar or identical to edge combiner circuit 700, as understood by those of skill in the art, may be used in DLL circuit 200.

Edge combiner circuit 700 receives delay line clock signals X0-X7 from delay line 500, and generates an output signal at output node CK_Out based on the received delay line clock signals. Edge combiner circuit 700 also receives frequency control signals Ctrl_0, Ctrl_3x, Ctrl_5x, and Ctrl_7x from control circuit 250, and generates the appropriate output signal based on the received frequency control signals.

As shown, each of delay line clock signals X0-X7 is received by a corresponding one AND gate bank of AND gate banks AB1-AB8, where each of AND gate banks AB1-AB8 includes three AND gates. As shown, each of the three AND gates of each AND gate bank AB[1-8] receives a corresponding clock signal X[0-7]. In addition, each of the three AND gates of each AND gate bank AB[1-8] receives one of the frequency control signals Ctrl_3x, Ctrl_5x, and Ctrl_7x.

In this embodiment, at most one of the frequency control signals Ctrl_3x, Ctrl_5x, and Ctrl_7x is high, and at least two of the frequency control signals Ctrl_3x, Ctrl_5x, and Ctrl_7x are low. Accordingly, at least two of the outputs of each of the AND gate banks AB1-AB8 are fixed low, and, if one of the frequency control signals Ctrl_3x, Ctrl_5x, and Ctrl_7x is high, the AND gate receiving the high frequency control signal generates an output corresponding with its received clock signal X[0-7].

When all of the frequency control signals Ctrl_3x, Ctrl_5x, and Ctrl_7x are low, all of the outputs of the AND gate banks AB1-AB8 are fixed low.

As illustrated in FIG. 7, AND OR circuit AO7 receives the 7X outputs of AND gate banks AB1-AB8, AND OR circuit AO5 receives the 5X outputs of AND gate banks AB1-AB8, AND OR circuit AO3 receives the 3X outputs of AND gate banks AB1-AB8.

The control circuit 250 causes frequency control signal Ctrl_7x to be high, for example, when output frequency of the output clock of DLL circuit 200 is to be seven times the frequency of the input clock.

In response to the control circuit 250 causing frequency control signal Ctrl_7x to be high, the 7X outputs of AND gate banks AB1-AB8 respectively correspond with delay line clock signals X0-X7. AND OR circuit AO7 receives the 7X outputs of AND gate banks AB1-AB8, and generates a clock signal at node CK_7x according to the logic illustrated in the schematic.

In response to frequency control signals Ctrl_3x and Ctrl_5x being low while frequency control signal Ctrl_7x is high, the 3X and 5X outputs of AND gate banks AB1-AB8 are low. Accordingly, AND OR circuits AO3 and AO5 receives only low signal inputs, and therefore respectively generate fixed low clock signals at nodes CK_3x and CK_5x.

The control circuit 250 causes frequency control signal Ctrl_5x to be high, for example, when output frequency of the output clock of DLL circuit 200 is to be five times the frequency of the input clock.

In response to the control circuit 250 causing frequency control signal Ctrl_5x to be high, the 5X outputs of AND gate banks AB1-AB6 respectively correspond with delay line clock signals X0-X5. AND OR circuit AO5 receives the 5X outputs of AND gate banks AB1-AB6, and generates a clock signal at node CK_5x according to the logic illustrated in the schematic.

In this embodiment, the control circuit 250 causes delay line 500 to force delay line clock signals X6 and X7 to be low. Accordingly, the 5X outputs of AND gate banks AB7 and AB8 are low.

In response to frequency control signals Ctrl_3x and Ctrl_7x being low while frequency control signal Ctrl_5x is high, the 3X and 7X outputs of AND gate banks AB1-AB8 are low. Accordingly, AND OR circuits AO3 and AO7 receives only low signal inputs, and therefore respectively generate fixed low clock signals at nodes CK_3x and CK_7x.

The control circuit 250 causes frequency control signal Ctrl_3x to be high, for example, when output frequency of the output clock of DLL circuit 200 is to be three times the frequency of the input clock.

In response to the control circuit 250 causing frequency control signal Ctrl_3x to be high, the 3X outputs of AND gate banks AB1-AB6 respectively correspond with delay line clock signals X0-X3. AND OR circuit AO3 receives the 3X outputs of AND gate banks AB1-AB4, and generates a clock signal at node CK_3x according to the logic illustrated in the schematic.

In this embodiment, the control circuit 250 causes delay line 500 to force delay line clock signals X4-X7 to be low. Accordingly, the 3X outputs of AND gate banks AB5-AB8 are low.

In response to frequency control signals Ctrl_5x and Ctrl_7x being low while frequency control signal Ctrl_3x is high, the 5X and 7X outputs of AND gate banks AB1-AB8 are low. Accordingly, AND OR circuits AO5 and AO7 receives only low signal inputs, and therefore respectively generate fixed low clock signals at nodes CK_5x and CK_7x.

Output stage 710 receives the clock signals at nodes CK_3x, CK_5x, and CK_7x, frequency control signals Ctrl_0, Ctrl_3x, Ctrl_5x, and Ctrl_7x, and a clock signal at node Xin which is identical or substantially identical to the input clock at input node Vin.

In accordance with the logic of the illustrated schematic, if any of frequency control signals Ctrl_3x, Ctrl_5x, and Ctrl_7x are high, the output stage 710 generates an output signal at output node CK_Out according to the clock signal at the one of nodes CK_3x, CK_5x, and CK_7x corresponding with the high control signal.

In addition, if frequency control signal Ctrl_0 is high, the output stage 710 generates a fixed low as the output signal at output node CK_Out.

Furthermore, if all of frequency control signals Ctrl_0, Ctrl_3x, Ctrl_5x, and Ctrl_7x are low, the output stage 710 generates an output signal at output node CK_Out according to the clock signal at node Xin.

As illustrated, each of clock signals X0-X7 has an identical schematic load. Each of clock signals X0-X7 drives one input of each of the AND gates of the corresponding AND gate bank. In addition, at most only one of the AND gates of the corresponding AND gate bank has a switching output. Accordingly, at least two of the AND gates of the corresponding AND gate bank have a fixed output. Each of clock signals X0-X7 having an identical schematic load is advantageous at least because propagation delay variation among clock signals X0-X7 is minimized. Because the schematic loads are identical, the cause of propagation delay variation among clock signals X0-X7 is limited to physical layout variations and manufacturing variations, as understood by those of skill in the art. In some embodiments, physical layout variations are eliminated by using identical physical layouts for like circuits and wiring connections, as understood by those of skill in the art. In some embodiments, each of buffers B0-B7 are oversized for the load they are driving. Consequently, propagation delay variation among clock signals X0-X7 caused by manufacturing variations are reduced, as understood by those of skill in the art.

In order to ensure that the schematic loads of clock signals X0-X7 are identical, certain AND gates of AND banks AB1-AB8 are included but have outputs which are not connected to inputs of any other circuits. For example, AND gates which generate outputs 3X_5, 3X_6, 3X_7, and 3X_8 have outputs which are not connected to any other circuits. Similarly, AND gates which generate outputs 5X_7 and 5X_8 have outputs which are not connected to any other circuits.

As illustrated, each of the AND gate output signals for a particular AND OR circuit has an identical schematic load. Each AND gate of the AND banks AB1-AB8 drives inputs of two AND gates the corresponding AND OR circuit. Each of the AND gate output signals for a particular AND OR circuit having an identical schematic load is advantageous at least because propagation delay variation among the AND gate output signals is minimized. Because the schematic loads are identical, the cause of propagation delay variation among the AND gate output signals is limited to physical layout variations and manufacturing variations, as understood by those of skill in the art. In some embodiments, physical layout variations are eliminated by using identical physical layouts for like circuits and wiring connections, as understood by those of skill in the art. In some embodiments, each of the AND gates of AND gate banks AB1-AB8 are oversized for the load they are driving. Consequently, propagation delay variation among the output signals of the AND gate banks AB1-AB8 caused by manufacturing variations are reduced, as understood by those of skill in the art.

In order to ensure that the schematic loads of the AND gate output signals for a particular AND OR circuit are identical, certain AND gates of the AND OR circuits AO3, AO5, and AO7 are included but have outputs which are not connected to inputs of any other circuits. For example, the AND gate of AND OR circuit AO3, which receives AND gate output signals 3X_1 and 3X_4 generates an output which is not connected to any other circuits. Similarly, the AND gate of AND OR circuit AO5, which receives AND gate output signals 5X_1 and 5X_6 generates an output which is not connected to any other circuits, and the AND gate of AND OR circuit AO7, which receives AND gate output signals 7X_1 and 7X_6 generates an output which is not connected to any other circuits.

As illustrated, each of the AND gates of a particular AND OR of the AND OR circuits AO3, AO5, and AO7 has an identical schematic load. Each AND gate of the AND OR circuits AO3, AO5, and AO7 drives inputs of the OR gate of the associated AND OR circuit AO3, AO5, or AO7. Each of the AND gates of the AND OR circuits AO3, AO5, and AO7 having an identical schematic load is advantageous at least because propagation delay variation among the AND gate output signals is minimized. Because the schematic loads are identical, the cause of propagation delay variation among the AND gate output signals is limited to physical layout variations and manufacturing variations, as understood by those of skill in the art. In some embodiments, physical layout variations are eliminated by using identical physical layouts for like circuits and wiring connections, as understood by those of skill in the art. In some embodiments, each of the AND gates of the AND OR circuits AO3, AO5, and AO7 are oversized for the load they are driving. Consequently, propagation delay variation among the output signals of the AND gates of the AND OR circuits AO3, AO5, and AO7 caused by manufacturing variations are reduced, as understood by those of skill in the art.

Another inventive aspect is a DLL circuit, including a delay line configured to receive a delay line input clock defining an input clock period, and where the delay line includes a plurality of delay stages, each configured to generate an output clock having a phase relative to the input clock based on a delay of the delay line, an edge combiner, configured to generate a DLL output clock based on the output clocks of the delay stages, and a control circuit configured to select which of the output clocks the edge combiner bases the DLL output clock on.

In some embodiments, the control circuit is configured to change which of the output clocks the edge combiner uses to generate the DLL output clock.

In some embodiments, changing which of the output clocks the edge combiner uses to generate the DLL output clock, causes a frequency of the DLL output clock to change.

In some embodiments, the control circuit is configured to change the delay of the delay line so as to cause a phase difference between the delay line input clock and a sensed output clock to be substantially equal to the period of the delay line input clock.

In some embodiments, the control circuit is configured to change which of the output clocks is sensed.

In some embodiments, the sensed output clock is a divided version of another output clock.

In some embodiments, the edge combiner is configured to generate the DLL output clock based on the delay line input clock, the sensed output clock, and any other output clocks having phase differences relative to the delay line input clock which are less than the sensed output clock.

In some embodiments, the delay line includes N delay stages generating N output clocks, where N is an integer, where a first delay stage through an Nth delay stage are sequentially connected in series, and where the control circuit is configured to select any of the Nth output clock and at least one other output clock as the sensed output clock.

In some embodiments, the control circuit is configured to select a particular output clock as the sensed output clock and to power down delay stages generating outputs clocks having phase differences relative to the delay line input clock which are greater than the phase difference of the selected output clock.

Another inventive aspect is a DLL circuit, including a delay line configured to receive a delay line input clock defining an input clock period, where the delay line includes a plurality of delay stages, each configured to generate an output clock having a phase relative to the input clock based on a delay of the delay line, an edge combiner, configured to generate a DLL output clock based on the output clocks of the delay stages, and a control circuit configured to change the delay of the delay line so as to cause a phase difference between the delay line input clock and a sensed output clock to be substantially equal to the period of the delay line input clock, where the control circuit is configured to change which of the output clocks is sensed.

In some embodiments, the sensed output clock is a divided version of another output clock.

In some embodiments, the delay line includes N delay stages generating N output clocks, where N is an integer, where a first delay stage through an Nth delay stage are sequentially connected in series, and where the control circuit is configured to select any of the Nth output clock and at least one other output clock as the sensed output clock.

In some embodiments, the control circuit is configured to select a particular output clock as the sensed output clock and to power down delay stages generating outputs clocks having phase differences relative to the delay line input clock which are greater than the phase difference of the selected output clock.

In some embodiments, the control circuit is configured to change which of the output clocks the edge combiner bases the DLL output clock on.

In some embodiments, changing which of the output clocks the edge combiner uses to generate the DLL output clock, causes a frequency of the DLL output clock to change.

In some embodiments, the edge combiner is configured to generate the DLL output clock based on the delay line input clock, the sensed output clock, and any other output clocks having phase differences relative to the delay line input clock which are less than the sensed output clock.

Another inventive aspect is a DLL circuit, including no more than one delay line, where the delay line is configured to receive a delay line input clock defining an input clock period, and where the delay line includes a plurality of delay stages, each configured to generate an output clock having a phase relative to the input clock based on a delay of the delay line, an edge combiner, configured to generate a DLL output clock having a DLL output clock frequency based on the output clocks of the delay stages, and a control circuit configured to change the delay of the delay line so as to cause a phase difference between the delay line input clock and a sensed one of the output clocks to be substantially equal to the period of the delay line input clock, where the control circuit is configured to change the DLL output clock frequency of the DLL output clock.

In some embodiments, the control circuit is configured to change which of the output clocks is sensed.

In some embodiments, the control circuit is configured to change which of the output clocks the edge combiner bases the DLL output clock on.

In some embodiments, to change the DLL output clock frequency of the DLL output clock, the control circuit changes which of the output clocks is sensed and changes which of the output clocks the edge combiner bases the DLL output clock on.

Another inventive aspect is a DLL circuit, including a delay line configured to receive a delay line input clock defining an input clock period, where the delay line includes a plurality of delay stages, each configured to generate a corresponding output clock having a phase relative to the input clock based on a delay of the delay line, a control circuit configured to change the delay of the delay line so as to cause a phase difference between the delay line input clock and a sensed output clock to be substantially equal to the period of the delay line input clock, and an edge combiner, configured to generate a DLL output clock based on the output clocks of the delay stages, where the edge combiner presents an equal schematic load for each of the output clocks.

In some embodiments, the edge combiner includes a plurality of first sets of logic gates and a plurality of second sets of logic gates, where each logic gate of each set of the first set of logic gates is configured to receive an output clock of a different one of the delay stages, where one or more of the logic gates of each set of the first sets of logic gates are configured to generate an output for a corresponding set of logic gates of the second sets of logic gates, and where each of the one or more of the logic gates of the first sets of logic gates configured to generate an output for the corresponding set of logic gates of the second sets of logic gates has an equal schematic output load.

In some embodiments, the edge combiner includes a third set of logic gates, where each logic gate of each set of the second set of logic gates is configured to receive outputs of a different pair of logic gates of the first set of logic gates, where at least two of the logic gates of each set of the second sets of logic gates are configured to generate an output for a corresponding logic gate of the third set of logic gates, and where each of the at least two logic gates of the second sets of logic gates configured to generate the output for the corresponding logic gate of the third set of logic gates has an equal schematic output load.

In some embodiments, each logic gate of the third set of logic gates is configured to receive outputs of a different set of the second sets of logic gates.

In some embodiments, the logic gates of the third set of logic gates are each configured to generate a clock having a frequency different from a frequency of the clocks of one or more other logic gates generated by the third set of logic gates.

In some embodiments, the delay stages each include an output driver configured to generate an output clock for one of the logic gates of each of the first sets of logic gates, where the output driver is oversized.

In some embodiments, the delay stages each include an output driver configured to generate an output clock for one of the logic gates of each of the first sets of logic gates, where the output clock of one or more of the delay stages is received by one or more logic gates of the first sets of logic gates, and where the one or more logic gates of the first sets of logic gates are never used to generate the DLL output clock.

In some embodiments, the logic gates of the first sets of logic gates are oversized.

In some embodiments, the outputs of at least two of the logic gates of the first set of logic gates is received by each logic gate of the second sets of logic gates, where one or more logic gates of the second sets of logic gates are never used to generate the DLL output clock.

In some embodiments, the logic gates of the second sets of logic gates are oversized.

Another inventive aspect is a method of using a DLL circuit, the method including with a delay line having a plurality of delay stages, receiving a delay line input clock defining an input clock period, and with each of the delay stages, generating a corresponding output clock having a phase relative to the input clock based on a delay of the delay line, with a control circuit, changing the delay of the delay line so as to cause a phase difference between the delay line input clock and a sensed output clock to be substantially equal to the period of the delay line input clock, and with an edge combiner, generating a DLL output clock based on the output clocks of the delay stages, where the edge combiner presents an equal schematic load for each of the output clocks.

In some embodiments, the edge combiner includes a plurality of first sets of logic gates and a plurality of second sets of logic gates, where the method further includes with each logic gate of each set of the first set of logic gates, receiving an output clock of a different one of the delay stages, and with one or more of the logic gates of each set of the first sets of logic gates, generating an output for a corresponding set of logic gates of the second sets of logic gates, where each of the one or more of the logic gates of the first sets of logic gates generating an output for the corresponding set of logic gates of the second sets of logic gates has an equal schematic output load.

In some embodiments, the edge combiner includes a third set of logic gates, where the method further includes with each logic gate of each set of the second sets of logic gates, receiving outputs of a different pair of logic gates of the first set of logic gates, and with at least two of the logic gates of each set of the second sets of logic gates, generating an output for a corresponding logic gate of the third set of logic gates, where each of the at least two logic gates of the second sets of logic gates generating the output for the corresponding logic gate of the third set of logic gates has an equal schematic output load.

In some embodiments, the method also includes with each logic gate of the third set of logic gates, receiving outputs of a different set of the second sets of logic gates.

In some embodiments, the logic gates of the third set of logic gates, generating a clock having a frequency different from a frequency of the clocks of one or more other logic gates generated by the third set of logic gates.

In some embodiments, the delay stages each include an output driver, where the method further includes, with the output driver of each of the delay stages, generating an output clock for one of the logic gates of each of the first sets of logic gates, where the output driver is oversized.

In some embodiments, the delay stages each include an output driver, where the method further includes with the output driver of each of the delay stages, generating an output clock for one of the logic gates of each of the first sets of logic gates, and with one or more logic gates of the first sets of logic gates, receiving the output clock of one or more of the delay stages, where the one or more logic gates of the first sets of logic gates are never used to generate the DLL output clock.

In some embodiments, the logic gates of the first sets of logic gates are oversized.

In some embodiments, the method also includes, with each logic gate of the second sets of logic gates, receiving the outputs of at least two of the logic gates of the first set of logic gates, where one or more logic gates of the second sets of logic gates are never used to generate the DLL output clock.

In some embodiments, the logic gates of the second sets of logic gates are oversized.

Though the present invention is disclosed by way of specific embodiments as described above, those embodiments are not intended to limit the present invention. Based on the methods and the technical aspects disclosed herein, variations and changes may be made to the presented embodiments by those of skill in the art without departing from the spirit and the scope of the present invention.

What is claimed is:
1. A DLL circuit, comprising:
   a multiplexer;
   a delay line,
   wherein the multiplexer is configured to cause the delay line to receive a first input clock input to the DLL circuit, and to generate a plurality of output clocks each having a phase based on the first input clock and on a delay of the delay line, wherein the delay of the delay line is controlled at least partly by a sensed phase difference between the first input clock and a particular one of the output clocks,
   wherein the multiplexer is further configured to cause the delay line to receive a second input clock, wherein the second input clock is generated based on one of the output clocks, wherein the delay line is configured to generate the output clocks such that the phase of each of the output clocks is based on the received second input clock and on the delay of the delay line, and wherein the delay of the delay line is controlled at least partly by a sensed frequency difference between the first input clock and the second input clock; and an edge combiner, configured to generate a DLL output clock based on the output clocks generated by the delay line.

2. The DLL circuit of claim 1, further comprising:
a voltage generator configured to generate an analog voltage based on the phase difference between the first input clock and the particular one of the output clocks generated by the delay line; and
a control circuit configured to cause the delay line to receive the first input clock while changing the delay of the delay line based on the analog voltage.

3. The DLL circuit of claim 2, wherein the voltage generator comprises:
a phase frequency detector, configured to generate a phase difference output based on the phase difference between the first input clock and the particular one of the output clocks generated by the delay line;
a loop filter, configured to store the analog voltage; and
a charge pump, configured to modify the analog voltage according to the phase difference output of the phase frequency detector.

4. The DLL circuit of claim 1, further comprising a control circuit configured to cause the delay line to receive the second input clock while changing the delay of the delay line based on an indication of the frequency difference.

5. The DLL circuit of claim 4, further comprising a delay sense circuit, wherein the control circuit is configured to receive the indication of the frequency difference from the delay sense circuit.

6. The DLL circuit of claim 5, wherein the delay sense circuit comprises a counter configured to count in response to the first input clock, and to reset in response to the second input clock, and wherein an output of the counter provides the indication of the frequency difference.

7. The DLL circuit of claim 1, wherein the delay line is programmable, and wherein the DLL circuit further comprises a control circuit configured to cause the delay line to receive the second input clock while changing the delay of the delay line by programming the programmable delay line.

8. The DLL circuit of claim 1, wherein the delay line comprises a plurality of delay stages, each having a current starved inverter, and wherein the DLL circuit further comprises a control circuit configured to cause the delay line to receive the first input clock while changing the delay of the delay line by changing the current to the current starved inverters.

9. The DLL circuit of claim 1, further comprising a control circuit configured to cause the delay line to receive the second input clock in response to at least one of the phase and frequency of a particular one of the output clocks generated by the delay line being different from that of the first input clock by an amount greater than a threshold.

10. The DLL circuit of claim 9, wherein the threshold corresponds with a condition that the frequency of the particular one output clock is approximately half of the frequency of the first input clock.

11. The DLL circuit of claim 1, further comprising a control circuit configured to cause the delay line to receive the first input clock in response to at least one of the phase and frequency of the second input clock of the delay line being different from that of the first input clock by an amount less than a threshold.

12. The DLL circuit of claim 11, wherein the threshold corresponds with a condition that the frequency of the second input clock is approximately half of a frequency of the first input clock.

13. A method of operating a DLL circuit, the method comprising:
with a multiplexer of the DLL circuit, causing a delay line of the DLL circuit to receive a first input clock, and to generate a plurality of output clocks each having a phase based the first input clock and on a delay of the delay line, wherein the delay of the delay line is controlled at least partly by a sensed phase difference between the first input clock and a particular one of the output clocks;
with the multiplexer, causing the delay line to receive a second input clock, wherein the second input clock is generated based on one of the output clocks, wherein the delay line is configured to generate the plurality of output clocks such that the phase of each of the output clocks is based on the received second input clock and on the delay of the delay line, and wherein the delay of the delay line is controlled at least partly by a sensed frequency difference between the first input clock and the second input clock; and
with an edge combiner of the DLL circuit, generating a DLL output clock based on the output clocks generated by the delay line.

14. The method of claim 13, further comprising, with a voltage generator, generating an analog voltage based on the phase difference between the first input clock and the particular one of the output clocks generated by the delay line; and
with a control circuit, causing the delay line to receive the first input clock while changing the delay of the delay line based on the analog voltage.

15. The method of claim 14, wherein the voltage generator comprises:
a phase frequency detector, configured to generate a phase difference output based on the phase difference between the first input clock and the particular one of the output clocks generated by the delay line;
a loop filter, configured to store the analog voltage; and
a charge pump, configured to modify the analog voltage according to the phase difference output of the phase frequency detector.

16. The method of claim 13, further comprising:
with a control circuit, causing the delay line to receive the second input clock while changing the delay of the delay line based on an indication of the delay of the delay line; frequency difference; and
with the control circuit, receiving the indication of the frequency difference a delay sense circuit, wherein the delay sense circuit comprises a counter configured to count in response to the first input clock, and to reset in response to the second input clock, and wherein an output of the counter provides the indication of the frequency difference.

17. The method of claim 13, wherein the delay line is programmable, and wherein the method further comprises, with a control circuit, causing the delay line to receive the second input clock while changing the delay of the delay line by programming the programmable delay line.

18. The method of claim 13, wherein the delay line comprises a plurality of delay stages, each having a current starved inverter, and wherein the method further comprises, with a control circuit, causing the delay line to receive the first input clock while changing the delay of the delay line by changing the current to the current starved inverters.

19. The method of claim 13, further comprising, with a control circuit, causing the delay line to receive the second input clock in response to at least one of the phase and frequency of the a particular one output clock of the delay line being different from that of the first input clock by an amount greater than a threshold, wherein the threshold corresponds with a condition that the frequency of the particular one output clock is approximately half of the frequency of the first input clock.

20. The method of claim 13, further comprising, with a control circuit, causing the delay line to receive the first input clock in response to at least one of the phase and frequency of the second input clock being different from the first input clock by an amount less than a threshold, wherein the threshold corresponds with a condition that the frequency of the second input clock is approximately half of the frequency of the first input clock.

* * * * *